(12) United States Patent
Takuma

(10) Patent No.: US 11,062,930 B2
(45) Date of Patent: Jul. 13, 2021

(54) SUBSTRATE PROCESSING DEVICE AND SUBSTRATE CONVEYING METHOD

(71) Applicant: TOKYO ELECTRON LIMITED, Tokyo (JP)

(72) Inventor: Kouji Takuma, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/500,969

(22) PCT Filed: Apr. 4, 2018

(86) PCT No.: PCT/JP2018/014470
§ 371 (c)(1),
(2) Date: Oct. 4, 2019

(87) PCT Pub. No.: WO2018/186451
PCT Pub. Date: Oct. 11, 2018

(65) Prior Publication Data
US 2020/0035532 A1 Jan. 30, 2020

(30) Foreign Application Priority Data

Apr. 6, 2017 (JP) .............................. JP2017-075657

(51) Int. Cl.
*H01L 21/677* (2006.01)

(52) U.S. Cl.
CPC .... *H01L 21/67745* (2013.01); *H01L 21/6773* (2013.01); *H01L 21/67715* (2013.01); *H01L 21/67775* (2013.01); *H01L 21/67781* (2013.01)

(58) Field of Classification Search
CPC ..................... H01L 21/67745; H01L 21/67715
See application file for complete search history.

(56) References Cited

U.S. PATENT DOCUMENTS

2015/0268660 A1* 9/2015 Hirato ............... H01L 21/67766
700/112
2017/0062251 A1* 3/2017 Ayabe ............... H01L 21/67781

FOREIGN PATENT DOCUMENTS

| JP | 2005-39285 A | 2/2005 |
|---|---|---|
| JP | 2006-179528 A | 7/2006 |
| JP | 2011-119468 A | 6/2011 |
| JP | 4767783 B2 | 6/2011 |

* cited by examiner

*Primary Examiner* — Lynn E Schwenning
(74) *Attorney, Agent, or Firm* — Nath, Goldberg & Meyer; Jerald L. Meyer; Tanya E. Harkins

(57) ABSTRACT

A substrate processing apparatus according to an embodiment includes a carrier mounting part, a substrate mounting part, a first transfer device, a plurality of processing parts, a second transfer device and a controller. The carrier mounting part mounts a carrier that accommodates a plurality of substrates. The first transfer device transfers the substrates between the carrier and a substrate mounting part. The controller causes the first transfer device to execute a take-out operation for taking out the substrate from the carrier to mount the substrate on the substrate mounting part at time intervals equal to or longer than a time required for the first transfer device to take out the substrate from the carrier to mount the substrate on the substrate mounting part and to take out the substrate from the substrate mounting part to accommodate the substrate in the carrier.

10 Claims, 10 Drawing Sheets

FIG. 7

| Route securing conditions | |
|---|---|
| The first transfer device does not hold the wafer | Q1 |
| An empty slot for the unprocessed wafer exists in the delivery part | Q2 |
| The second transfer device does not hold the wafer | Q3 |
| An empty processing unit exists | Q4 |
| Preparation for the process start in the empty processing unit is complete | Q5 |
| An empty slot for the processed wafer exists in the delivery part | Q6 |

…

SUBSTRATE PROCESSING DEVICE AND SUBSTRATE CONVEYING METHOD

This is a National Phase Application filed under 35 U.S.C. 371 as a national stage of PCT/JP2018/014470, filed Apr. 4, 2018, an application claiming the benefit of Japanese Application No. 2017-075657, filed Apr. 6, 2017, the content of each of which is hereby incorporated by reference in its entirety.

TECHNICAL FIELD

Embodiments of the present disclosure relate to a substrate processing apparatus and a substrate transfer method.

BACKGROUND

Conventionally, a substrate processing apparatus for processing a substrate such as a semiconductor wafer, a glass substrate or the like is known. For example, Patent Document 1 describes a substrate processing apparatus including a substrate mounting part on which a substrate is mounted, a first transfer device configured to transfer the substrate between a carrier for accommodating a plurality of substrates and the substrate mounting part, a plurality of processing parts for processing the substrate, and a second transfer device configured to transfer the substrate between the processing parts and the substrate mounting part.

In the substrate processing apparatus described in Patent Document 1, the first transfer device takes out a plurality of substrates from the carrier, and temporarily mounts the taken-out substrates on the substrate mounting part. Subsequently, the second transfer device takes out the substrates one by one from the substrate mounting part and transfers them to the processing parts. Subsequently, when the processing in the processing parts is completed, the second transfer device takes out the processed substrates from the processing units, and temporarily mounts the taken-out substrates on the substrate mounting part. Then, the first transfer device takes out a plurality of substrates from the substrate mounting part and returns them to the carrier.

As described above, in the substrate processing apparatus described in Patent Document 1, the transfer of the substrate between the first transfer device and the second transfer device is performed via the substrate mounting part.

PRIOR ART DOCUMENT

Patent Document

Patent Document 1: Japanese Patent No. 4767783

However, the substrate processing apparatus described in Patent Document 1 has room for further improvement in that all the substrates in the substrate mounting part should not stay in the substrate mounting part for a time longer than an allowable time.

The present disclosure provides some embodiments of a substrate processing apparatus and a substrate transfer method capable of preventing all substrates in a substrate mounting part from staying in the substrate mounting part for a time longer than an allowable time.

SUMMARY

A substrate processing apparatus according to one embodiment of the present disclosure includes a carrier mounting part, a substrate mounting part, a first transfer device, a plurality of processing parts, a second transfer device and a control part. The carrier mounting part is configured to mount a carrier that accommodates a plurality of substrates. The substrate mounting part is capable of mounting the plurality of substrates. The first transfer device is configured to transfer the substrates between the carrier mounted on the carrier mounting part and the substrate mounting part. The plurality of processing parts is configured to process the substrates. The second transfer device is configured to transfer the substrates between the plurality of processing parts and the substrate mounting part. The control part is configured to control the first transfer device, the plurality of processing parts and the second transfer device. Furthermore, the control part causes the first transfer device to execute a take-out operation for taking out the substrate from the carrier to mount the substrate on the substrate mounting part at time intervals equal to or longer than a time required for the first transfer device to take out the substrate from the carrier to mount the substrate on the substrate mounting part and to take out the substrate from the substrate mounting part to accommodate the substrate in the carrier.

According to the present disclosure, it is possible to prevent all substrates in a substrate mounting part from staying in the substrate mounting part for a time longer than an allowable time.

BRIEF DESCRIPTION OF DRAWINGS

FIG. 7 is a view showing an example of route securing conditions.

DETAILED DESCRIPTION

Hereinafter, embodiments of a substrate processing apparatus and a substrate transfer method disclosed in the subject application will be described in detail with reference to the accompanying drawings. In addition, the present disclosure is not limited by the embodiments described below.

Figure 1:
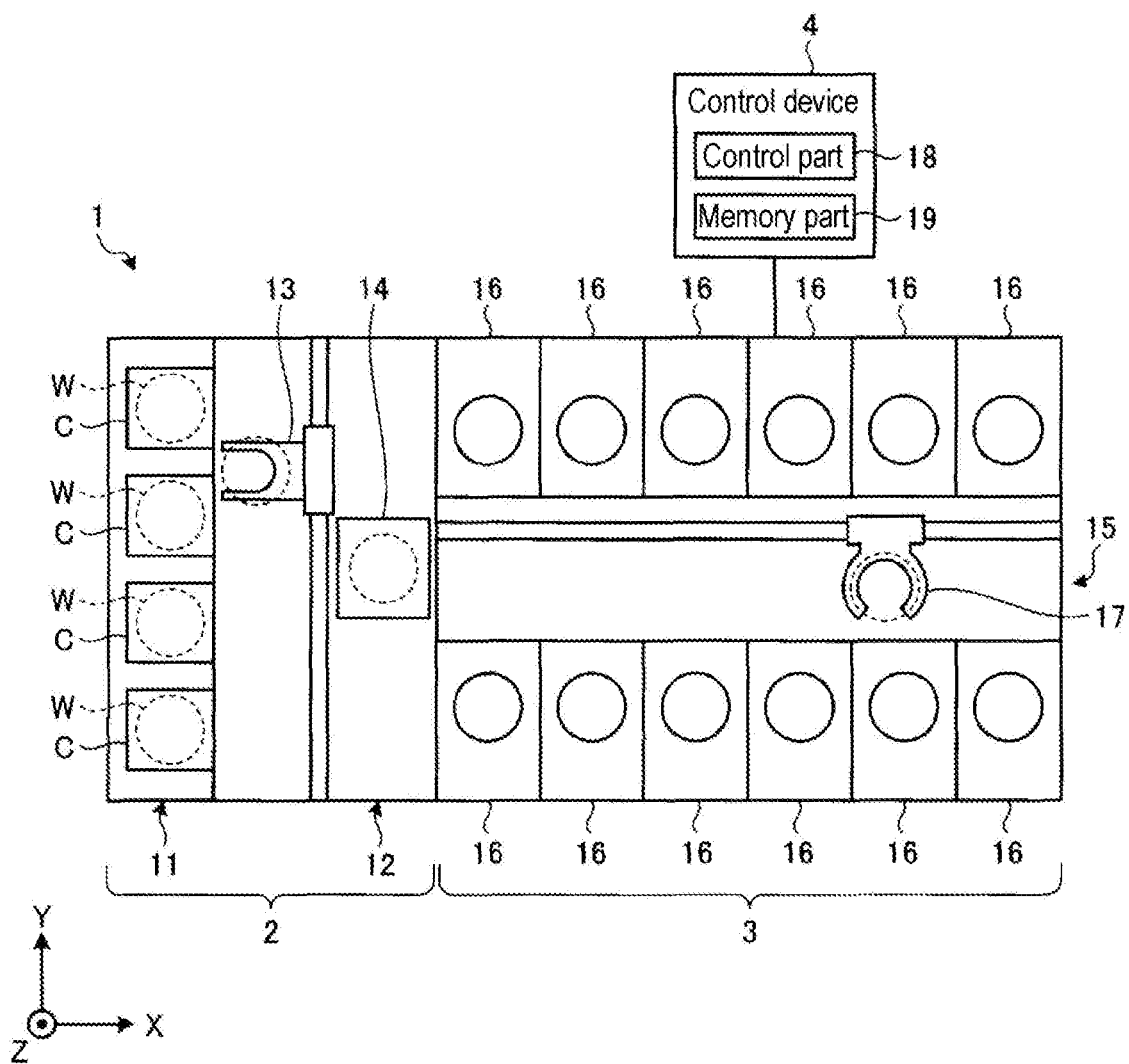
FIG. 1 is a view showing a schematic configuration of a substrate processing system according to the present embodiment.

FIG. 1 is a view showing a schematic configuration of a substrate processing system according to the present embodiment. In the following description, an X axis, a Y axis and a Z axis orthogonal to each other will be defined in order to clarify the positional relationship. The positive direction of the Z axis is defined as a vertically upward direction.

As shown in FIG. 1, the substrate processing system 1 includes a loading/unloading station 2 and a processing station 3. The loading/unloading station 2 and the processing station 3 are provided adjacent to each other.

The loading/unloading station 2 includes a carrier mounting part 11 and a transfer part 12. A plurality of carriers C that horizontally accommodate a plurality of substrates, for example, semiconductor wafers (hereinafter referred to as wafers W) in the present embodiment, is mounted on the carrier mounting part 11.

The transfer part 12 is provided adjacent to the carrier mounting part 11 and includes a substrate transfer device 13 and a delivery part 14 provided therein. The substrate transfer device 13 includes a wafer holding mechanism that holds a wafer W. Furthermore, the substrate transfer device 13 can move in a horizontal direction and a vertical direction and can rotate about a vertical axis. The substrate transfer device 13 transfers the wafer W between the carrier C and the delivery part 14 using the wafer holding mechanism.

The processing station 3 is provided adjacent to the transfer part 12. The processing station 3 includes a transfer part 15 and a plurality of processing units 16. The processing units 16 are provided side by side on both sides of the transfer part 15.

The transfer part 15 includes a substrate transfer device 17 provided therein. The substrate transfer device 17 includes a wafer holding mechanism that holds the wafer W. Furthermore, the substrate transfer device 17 can move in the horizontal direction and the vertical direction and can rotate about the vertical axis. The substrate transfer device 17 transfers the wafer W between the delivery part 14 and the processing units 16 using the wafer holding mechanism.

The processing unit 16 performs a predetermined substrate processing process on the wafer W transferred by the substrate transfer device 17.

Furthermore, the substrate processing system 1 includes a control device 4. The control device 4 is, for example, a computer, and includes a control part 18 and a memory part 19. The memory part 19 stores a program for controlling various processes executed in the substrate processing system 1. The control part 18 controls the operation of the substrate processing system 1 by reading and executing the program stored in the memory part 19.

Such a program may be recorded on a computer-readable storage medium and may be installed in the memory part 19 of the control device 4 from the storage medium. Examples of the computer-readable storage medium include a hard disk (HD), a flexible disk (FD), a compact disk (CD), a magneto-optical disk (MO) and a memory card.

In the substrate processing system 1 configured as described above, first, the substrate transfer device 13 of the loading/unloading station 2 takes out the wafer W from the carrier C mounted on the carrier mounting part 11 and mounts the taken-out wafer W on the delivery part 14. The wafer W mounted on the delivery part 14 is taken out from the delivery part 14 by the substrate transfer device 17 of the processing station 3 and is loaded into the processing unit 16.

The wafer W loaded into the processing unit 16 is processed by the processing unit 16. Thereafter, the wafer W is unloaded from the processing unit 16 by the substrate transfer device 17 and is mounted on the delivery part 14. Then, the processed wafer W mounted on the delivery part 14 is returned to the carrier C of the carrier mounting part 11 by the substrate transfer device 13.

Figure 2:
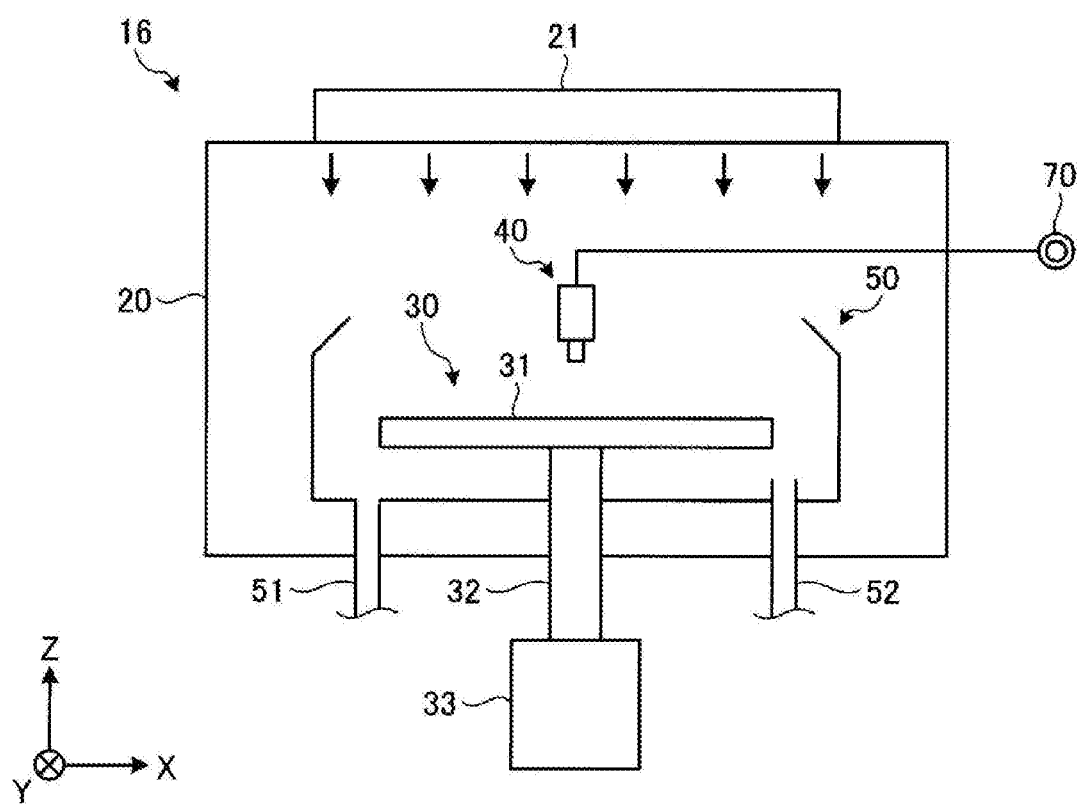
FIG. 2 is a view showing a schematic configuration of a processing unit.

Next, the processing unit 16 will be described with reference to FIG. 2. FIG. 2 is a view showing a schematic configuration of the processing unit 16.

As shown in FIG. 2, the processing unit 16 includes a chamber 20, a substrate holding mechanism 30, a processing fluid supply part 40 and a collection cup 50.

The chamber 20 accommodates the substrate holding mechanism 30, the processing fluid supply part 40 and the collection cup 50. An FFU (Fan Filter Unit) 21 is provided on the ceiling of the chamber 20. The FFU 21 forms a down flow in the chamber 20.

The substrate holding mechanism 30 includes a holding part 31, a support post part 32 and a driving part 33. The holding part 31 holds the wafer W horizontally. The support post part 32 is a member extending in the vertical direction. The base end portion of the support post part 32 is rotatably supported by the driving part 33. The distal end portion of the support post part 32 supports the holding part 31 horizontally. The driving part 33 rotates the support post part 32 about the vertical axis. The substrate holding mechanism 30 rotates the holding part 31 supported on the support post part 32 by rotating the support post part 32 using the driving part 33, thereby rotating the wafer W held by the holding part 31.

The processing fluid supply part 40 supplies a processing fluid to the wafer W. The processing fluid supply part 40 is connected to a processing fluid supply source 70.

The collection cup 50 is disposed so as to surround the holding part 31 and is configured to collect the processing liquid scattered from the wafer W due to the rotation of the holding part 31. A drain port 51 is formed at the bottom of the collection cup 50. The processing fluid collected by the collection cup 50 is discharged from the drain port 51 to the outside of the processing unit 16. Furthermore, an exhaust port 52 for discharging the gas supplied from the FFU 21 to the outside of the processing unit 16 is formed at the bottom of the collection cup 50.

Figure 3:
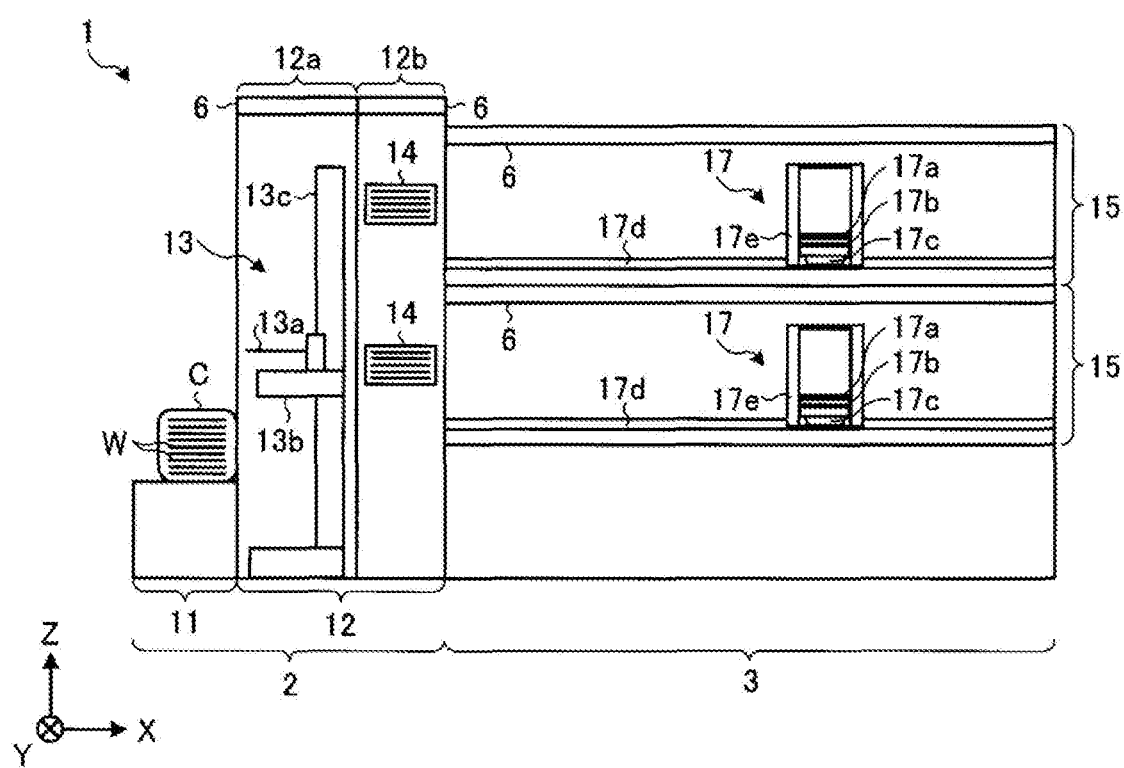
FIG. 3 is a view for explaining a wafer transfer route in the substrate processing system.

Next, the transfer route of the wafer W will be specifically described with reference to FIG. 3. FIG. 3 is a view for explaining a transfer route of the wafer W in the substrate processing system 1.

In addition, in FIG. 3, there is shown a simplified schematic side view in which the substrate processing system 1 is perspectively viewed from the negative direction of the Y axis. Hereinafter, the substrate transfer device 13 will be described as "first transfer device 13", and the substrate transfer device 17 will be described as "second transfer device 17".

First, the configuration of the loading/unloading station 2 will be specifically described. As shown in FIG. 3, the transfer part 12 of the loading/unloading station 2 includes a loading/unloading chamber 12a and a delivery chamber 12b.

The loading/unloading chamber 12a is provided adjacent to the carrier mounting part 11, and the first transfer device 13 is disposed therein. The first transfer device 13 includes a wafer holding mechanism 13a and a moving mechanism 13b. The wafer holding mechanism 13a can hold one wafer W. The moving mechanism 13b moves the wafer holding mechanism 13a up and down along a vertical guide 13c extending in the vertical direction. In addition, the moving mechanism 13b moves the wafer holding mechanism 13a along the horizontal direction and rotates the wafer holding mechanism 13a about the vertical axis.

In the present embodiment, it is assumed that the first transfer device 13 transfers the wafers W one by one. However, the first transfer device 13 may include a wafer holding mechanism capable of holding a plurality of wafers W and may collectively transfer the plurality of wafers W. This point will be described later.

The delivery chamber 12b is provided between the loading/unloading chamber 12a and the processing station 3. A plurality of (two, in the present embodiment) delivery parts 14 are disposed in the delivery chamber 12b. The two delivery parts 14 are arranged side by side in the height direction (Z axis direction).

Each delivery part 14 is an example of a "substrate mounting part" and has a plurality of slots capable of mounting a plurality of wafers W in multiple stages. Of the two delivery parts 14, the upper delivery part 14 holds the wafer W to be loaded and unloaded with respect to an upper transfer part 15 described later. Of the two delivery parts 14, the lower delivery part 14 holds the wafer W to be loaded and unloaded with respect to a lower transfer part 15 described later.

Each delivery part 14 may be divided into a unit on which the wafer W to be loaded into the transfer part 15 (i.e., the wafer W not processed by the processing unit 16) is mounted, and a unit on which the wafer W to be unloaded from the transfer part 15 (i.e., the wafer W processed by the processing unit 16) is mounted. In this case, each unit need only be capable of mounting at least one wafer W.

Next, the configuration of the processing station 3 will be specifically described. As shown in FIG. 3, the processing station 3 includes a plurality of (two, in the present embodiment) transfer parts 15. The transfer parts 15 are arranged side by side in the height direction (Z axis direction).

A second transfer device 17 is disposed in each transfer part 15. The second transfer device 17 includes a first wafer holding mechanism 17a, a second wafer holding mechanism 17b and a moving mechanism 17c.

The first wafer holding mechanism 17a and the second wafer holding mechanism 17b can hold one wafer W, respectively. Specifically, the first wafer holding mechanism 17a holds the wafer W not processed by the processing unit 16 (hereinafter sometimes referred to as "unprocessed wafer W"), and the second wafer holding mechanism 17b holds the wafer W processed by the processing unit 16 (hereinafter sometimes referred to as "processed wafer W").

The moving mechanism 17c moves the first wafer holding mechanism 17a and the second wafer holding mechanism 17b along a horizontal guide 17d extending in the horizontal direction (X axis direction) and moves the first wafer holding mechanism 17a and the second wafer holding mechanism 17b up and down along a vertical guide 17e extending in the vertical direction. Furthermore, the moving mechanism 17c moves the first wafer holding mechanism 17a and the second wafer holding mechanism 17b along the horizontal direction (Y axis direction) orthogonal to the extension direction of the horizontal guide 17d and rotates them about the vertical axis.

Although not shown here, the plurality of processing units 16 are arranged in the respective transfer parts 15. In the processing station 3, a space is provided below the lower transfer part 15. In this space, for example, a pipe box that accommodates various types of pipes and a chemical tank as a processing fluid supply source 70 are arranged.

Next, the transfer route of the wafer W will be described. First, the first transfer device 13 takes out one unprocessed wafer W from the carrier C and mounts it on the delivery part 14. Subsequently, the second transfer device 17 takes out one unprocessed wafer W from the delivery part 14 and loads it into one of the processing units 16. The unprocessed wafer W mounted on the upper delivery part 14 is taken out by the upper second transfer device 17 and loaded into the upper processing unit 16. Furthermore, the unprocessed wafer W mounted on the lower delivery part 14 is taken out by the lower second transfer device 17 and loaded into the lower processing unit 16.

Subsequently, when the processing by the processing unit 16 is completed, the second transfer device 17 takes out the processed wafer W from the processing unit 16 and mounts it on the delivery part 14. Then, the first transfer device 13 takes out the processed wafer W from the delivery part 14 and accommodates it in the carrier C.

As described above, the unprocessed wafer W is transferred from the carrier C via the first transfer device 13, the delivery part and the second transfer device 17 and loaded into the processing unit 16. Furthermore, the processed wafer W is returned from the processing unit 16 to the carrier C via the second transfer device 17, the delivery part 14 and the first transfer device 13.

By the way, when processing the wafer W, it is desirable to prevent the wafer W from coming into contact with an air as far as possible from the viewpoint of preventing the wafer W from being altered.

Therefore, in the substrate processing system 1, an inert gas (for example, a nitrogen gas) is supplied from the FFU 21 of the processing unit 16 into the chamber 20 so that the wafer W being processed by the processing unit 16 does not come into contact with an air.

On the other hand, FFUs 6 are also provided in the ceiling of the loading/unloading chamber 12a, the delivery part 14 and each transfer part 15 so that a purified air is supplied from the FFUs 6 to the loading/unloading chamber 12a, the delivery part 14 and each transfer part 15. Therefore, in order to prevent the wafer W from making contact with the air as far as possible, it is desirable to shorten the staying time of the wafer W in the loading/unloading chamber 12a, the delivery chamber 12b and the transfer part 15.

Although details will be described later, in the conventional substrate processing apparatus, a phenomenon in which the wafer W overstays in the delivery part 14 has occurred. Therefore, in the substrate processing system 1 according to the present embodiment, the timing at which the first transfer device 13 takes out the unprocessed wafer W from the carrier C is appropriately controlled in order to shorten the staying time of the wafer W in the delivery part 14. This point will be specifically described below.

Figure 4:
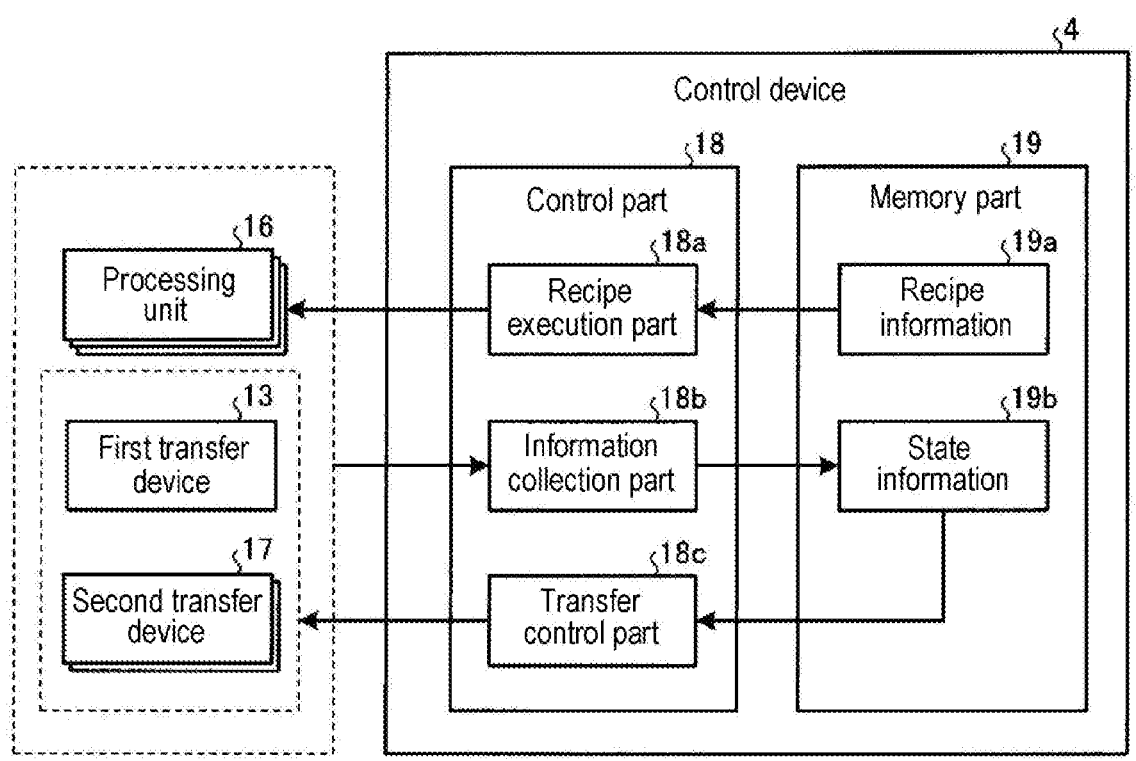
FIG. 4 is a block diagram illustrating an example of a configuration of a control device.

FIG. 4 is a block diagram illustrating an example of the configuration of the control device 4. FIG. 4 shows only some of a plurality of components included in the control device 4.

As shown in FIG. 4, the control device 4 includes a control part 18 and a memory part 19.

The control part 18 includes, for example, a microcomputer having a CPU (Central Processing Unit), a ROM (Read Only Memory), a RAM (Random Access Memory), an input/output port and the like, and various circuits. The control part 18 includes a plurality of processing parts that makes their functions when the CPU executes a program stored in the ROM using the RAM as a work area. Specifically, the control part 18 includes a recipe execution part 18a, an information collection part 18b and a transfer control part 18c. The recipe execution part 18a, the information collection part 18b and the transfer control part 18c may be partially or entirely configured by hardware such as an ASIC (Application Specific Integrated Circuit), an FPGA (Field Programmable Gate Array) or the like.

The memory part 19 is realized by, for example, a semiconductor memory element such as a RAM or a flash memory or the like, or a memory device such as a hard disk, an optical disk or the like. The memory part 19 stores recipe information 19a and state information 19b.

The recipe execution part 18a controls the processing unit 16 according to the recipe information 19a, thereby causing the processing unit 16 to execute processing on the wafer W.

For example, the recipe execution part 18a controls the processing unit 16 according to the recipe information 19a, thereby causing the processing unit 16 to perform processes including a chemical process for supplying a chemical liquid to the wafer W, a rinsing process for supplying a rinsing liquid to the wafer W and a drying process for drying the wafer W.

The recipe information 19a is information indicating the content of the processes to be executed by the processing unit 16. Specifically, the recipe information 19a includes information such as the execution order of each process, the process time, the types of processing fluids to be used, the discharge flow rate of the processing fluids, the position of the processing fluid supply part 40, the rotation speed of the holding part 31, and the like.

The information collection part 18b collects information on the state of the substrate processing system 1 from the first transfer device 13, the respective second transfer devices 17, the respective processing units 16 and various sensors (not shown) provided in the substrate processing system 1. Furthermore, the information collection part 18b stores the collected information in the memory part 19 as the state information 19b.

The state information 19b is information on the state of the substrate processing system 1. Specifically, the state information 19b includes at least information on "the state of the first transfer device 13", "the state of the delivery part 14", "the state of the second transfer device 17", and "the state of the processing unit 16".

The information on "the state of the first transfer device 13" and the information on "the state of the second transfer device 17" include information such as whether or not the wafer W is held and whether or not the wafer W is moving. Furthermore, the information on "the state of the delivery part 14" includes information on the number of empty slots. In addition, the information on "the state of the processing unit 16" includes information such as whether or not preparation for starting a process on the wafer W is complete, whether or not the wafer W is accommodated in the chamber 20, and whether or not a process on the wafer W is being executed.

The transfer control part 18c controls the first transfer device 13 and the second transfer device 17 based on the state information 19b.

Specifically, the transfer control part 18c instructs the first transfer device 13 to execute a "take-out operation" and a "collection operation", and instructs the second transfer device 17 to execute a "loading operation" and an "unloading operation". The "take-out operation" is an operation for taking out the unprocessed wafer W from the carrier C and mounting it on the delivery part 14. The "collection operation" is an operation for taking out the processed wafer W from the delivery part 14 and returning it to the carrier C. The "loading operation" is an operation for taking out the unprocessed wafer W from the delivery part 14 and loading it into the processing unit 16. The "unloading operation" is an operation for taking out the processed wafer W from the processing unit 16 and mounting it on the delivery part 14.

Based on the state information 19b, the transfer control part 18c instructs the second transfer device 17 to execute the "loading operation" when the unprocessed wafer W is mounted on the delivery part 14, and instructs the second transfer device 17 to execute the "unloading operation" when the processing by the processing unit 16 is completed.

On the other hand, the transfer control part 18c instructs the first transfer device 13 to execute the "take-out operation" and the "collection operation" at a timing determined by considering the elapsed time from the start of the previous "take-out operation" and the status of the transfer route of the wafer W.

Figure 5:
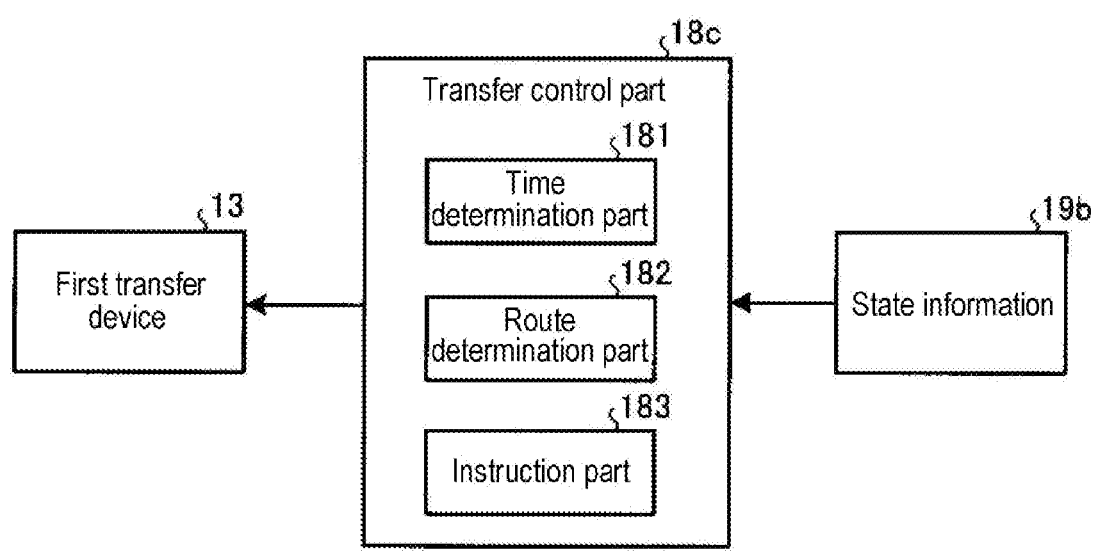
FIG. 5 is a block diagram illustrating an example of a configuration of a transfer control part.

An example of the specific configuration of the transfer control part 18c will now be described with reference to FIG. 5. FIG. 5 is a block diagram illustrating an example of the configuration of the transfer control part 18c. Furthermore, FIG. 5 shows only some of a plurality of components included in the transfer control part 18c.

As illustrated in FIG. 5, the transfer control part 18c includes a time determination part 181, a route determination part 182 and an instruction part 183.

The time determination part 181 determines whether or not the elapsed time from the start of the previous "take-out operation" has reached a threshold value. In this regard, the time set as the "threshold value" is the time equal to or longer than the required time (e.g., 20 sec) which is required until the first transfer device 13 takes out the unprocessed wafer W from the carrier C, mounts the unprocessed wafer W on the delivery part 14, takes out the processed wafer W from the delivery part 14 and accommodates the processed wafer W in the carrier C.

The required time is, for example, the shortest required time when the first transfer device 13 is caused to perform: an operation from a state in which the unprocessed wafer W waits at a predetermined initial position in a predetermined initial posture to the take-out of the unprocessed wafer W from the carrier C; an operation from the take-out of the unprocessed wafer W from the carrier C to the mounting of the unprocessed wafer W on the delivery part 14; an operation from the mounting of the unprocessed wafer W on the delivery part 14 to the take-out of the processed wafer W from the delivery part 14; an operation from the take-out of the processed wafer W from the delivery part 14 to the returning of the processed wafer W to the carrier C; and an operation from the returning of the processed wafer W to the carrier C to the restoration of the initial position and initial posture.

The route determination part 182 determines whether or not a transfer route of the wafer W is secured. As described above with reference to FIG. 3, the transfer route of the wafer W includes a forward route extending from the carrier C to the processing unit 16 and a return route from the processing unit 16 to the carrier C. Based on the state information 19b, the route determination part 182 determines whether or not the forward route and the return route are secured, i.e., whether or not the unprocessed wafer W can be loaded into the processing unit 16 without delay and the processed wafer W can be returned to the carrier C without delay.

The instruction part 183 instructs the first transfer device 13 to execute the "take-out operation" when the time determination part 181 determines that the elapsed time from the start of the previous "take-out operation" has reached a threshold value and when the route determination part 182 determines that the transfer route of the wafer W has been secured.

Figure 6:
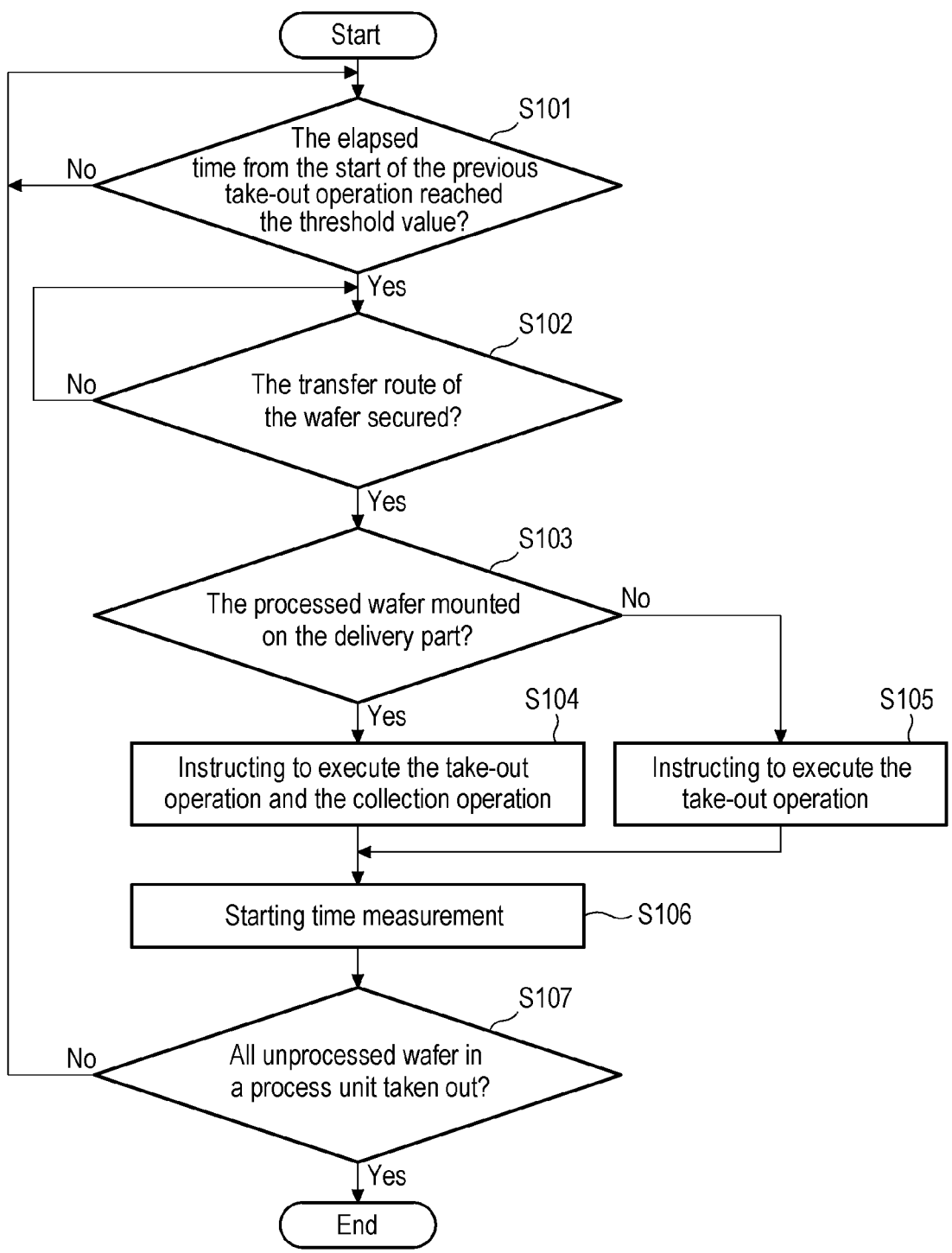
FIG. 6 is a flowchart showing an example of the content of a transfer control process for a first transfer device.

Next, the content of a transfer control process for the first transfer device 13 will be described with reference to FIG. 6. FIG. 6 is a flowchart showing an example of the content of the transfer control process for the first transfer device 13.

For example, the transfer control process shown in FIG. 6 is executed for each process unit in which a plurality of wafers W included in one carrier C is defined as one set. In FIG. 6, for the sake of easy understanding, the process of taking out the first wafer W from the carrier C and the process performed after taking out all the wafers W of the process unit from the carrier C are not shown. However, these processes will also be described below.

As shown in FIG. 6, the control part 18 determines whether or not the elapsed time from the start of the previous take-out operation by the first transfer device 13 has reached a threshold value (step S101). Specifically, the control part 18 determines whether or not the result of the time measurement started in step S106 described later has reached a threshold value.

If it is determined in step S101 that the elapsed time from the start of the previous take-out operation by the first transfer device 13 has reached the threshold value (if yes in step S101), the control part 18 causes the process to proceed to step S102. On the other hand, if the elapsed time has not reached the threshold value (if no in step S101), when the elapsed time has not reached the threshold (No in step S101), the control part 18 repeats the determination process in step S101 until the elapsed time reaches the threshold value.

For example, the processed wafer W does not exist in the delivery part 14 for a while after the start of the substrate processing process. Therefore, the first transfer device 13 executes only the "take-out operation" among the "take-out operation" and the "collection operation". In the case of performing only the "take-out operation", the first transfer device 13 can perform the "take-out operation" for the next wafer W for the time (e.g., 15 sec) shorter than the time (e.g., 20 sec) required for performing both the "take-out operation" and the "collection operation".

In such a state, if the first transfer device 13 is caused to perform the "take-out operation" at intervals of 15 sec, the first transfer device 13 performs the "take-out operation" for the next wafer W at intervals of 15 sec shorter than the time required for performing both the "take-out operation" and the "collection operation".

On the other hand, when the processed wafer W starts to be mounted on the delivery part 14, the first transfer device 13 performs both the "take-out operation" and the "collection operation" until all the unprocessed wafers W are taken out from the carrier C.

As described above, it takes 20 seconds at the shortest in order for the first transfer device 13 to perform both the "take-out operation" and the "collection operation". Herein, the substrate processing system 1 is set such that the second transfer device 17 mounts the processed wafer W on the delivery part 14 at the same intervals as the intervals at which the first transfer device 13 mounts the unprocessed wafer W on the delivery part 14. Therefore, the unprocessed wafer W taken out from the carrier C and mounted on the delivery part 14 while only the "take-out operation" among the "take-out operation" and the "collection operation" is performed is mounted on the delivery part 14 as a processed wafer W at intervals of 15 sec. On the other hand, the first transfer device 13 can take out the processed wafer W from the delivery part 14 only at intervals of 20 seconds at the shortest. As a result, the processed wafer W stays in the delivery part 14 and may stay longer than an allowable time.

Therefore, in the substrate processing system 1 according to the present embodiment, the first transfer device 13 is not instructed to execute the "take-out operation" until the time equal to or longer than the time required to perform both the "take-out operation" and the "collection operation", i.e., the time required for the first transfer device 13 to take out the unprocessed wafer W from the carrier C and mount the unprocessed wafer W on the delivery part 14 and to take out the processed wafer W from the delivery part 14 and accommodates the processed wafer W in the carrier C is elapsed.

As a result, it is possible to prevent the processed wafer W from overstaying in the delivery part 14 without taking out the processed wafer W from the delivery part 14 by the first transfer device 13 in a timely manner.

If the wafer W to be taken out from the carrier C is the first wafer in the process unit, the control part 18 skips the process of step S101 and proceeds to the process of step S102.

Subsequently, in step S102, the control part 18 determines whether or not a transfer route of the wafer W is secured. Specifically, the control part 18 determines whether or not the current state of the substrate processing system 1 satisfies predetermined route securing conditions based on the state information 19b.

An example of the route securing conditions will be described with reference to FIG. 7. FIG. 7 is a view showing an example of the route securing conditions.

As shown in FIG. 7, the route securing conditions includes, for example, a condition (condition Q1) that the first transfer device 13 does not hold the wafer W, a condition (condition Q2) that at least one empty slot for the unprocessed wafer W exists in the delivery part 14, a condition (condition Q3) that the second transfer device 17 does not hold the wafer W, a condition (condition Q4) that at least one empty processing unit 16 exists, a condition (condition Q5) that preparation for the process start in the empty processing unit 16 is complete, and a condition (condition Q6) that at least one empty slot for the processed wafer W exists in the delivery part 14.

The "empty processing unit 16" in the condition Q4 refers to the processing unit 16 having a state in which the wafer W is not accommodated in the chamber 20. In addition, the "preparation for the process start is complete" in the condition Q5 means that the wafer W can be immediately processed when the wafer W is accommodated in the chamber 20 of the empty processing unit 16. Specifically, the "preparation for the process start is complete" in the condition Q5 means that one or a plurality of processing fluids used in a series of processing processes on the wafer W can be discharged from the processing fluid supply part 40 (see FIG. 2).

The control part 18 determines whether or not the current state of the substrate processing system 1 satisfies the aforementioned conditions Q1 to Q6 based on the state information 19b. Then, if the conditions Q1 to Q6 are satisfied, the control part 18 determines that the transfer route of the wafer W is secured (yes in step S102), and causes the process to proceed to step S103. On the other hand, if the conditions Q1 to Q6 are not satisfied, i.e., if the transfer route of the wafer W is not secured (if no in step S102), the control part 18 repeats the process of step S102 until the conditions Q1 to Q6 are satisfied. When the process of step S102 continues for a predetermined time or more, the control part 18 may perform an abnormality handling process such as outputting an error signal or the like.

If the conditions Q1 and Q2 are satisfied, the first transfer device 13 can perform the "take-out operation" without delay. That is, when the condition Q1 is satisfied, the first transfer device 13 can immediately take out the unprocessed wafer W from the carrier C. When the condition Q2 is satisfied, the first transfer device 13 can mount the unprocessed wafer W taken out from the carrier C on the delivery part 14 without causing the unprocessed wafer W to overstay in the loading/unloading chamber 12*a*.

Furthermore, if the conditions Q3 and Q4 are satisfied, the second transfer device 17 can perform the "loading operation" without delay. That is, if the condition Q3 is satisfied, the second transfer device 17 can immediately take out the unprocessed wafer W mounted on the delivery part 14 from the delivery part 14. Therefore, it is possible to shorten the staying time of the unprocessed wafer W in the delivery part 14. Furthermore, if the condition Q4 is satisfied, the second transfer device 17 can immediately load the unprocessed wafer W taken out from the delivery part 14 into the processing unit 16 without causing the unprocessed wafer W to overstay in the transfer part 15.

When the unprocessed wafer W is loaded into the chamber 20, the processing unit 16 supplies an inert gas from the FFU 21 into the chamber 20. Accordingly, the wafer W is isolated from an air while being accommodated in the processing unit 16.

Furthermore, if the condition Q5 is satisfied, the processing unit 16 can immediately start executing a series of processes on the unprocessed wafer W. Therefore, the staying time of the wafer W in the processing unit 16 can be shortened as much as possible. If the condition Q6 is satisfied, i.e., if the return route of the transfer route of the wafer W is secured, the second transfer device 17 can immediately mount the processed wafer W unloaded from the processing unit 16 on the delivery part 14 without causing the processed wafer W to overstay in the transfer part 15.

In this way, by instructing the first transfer device 13 to execute the "take-out operation" in a state in which the conditions Q1 to Q6 are satisfied, the staying time of the wafer W in the loading/unloading chamber 12*a*, the delivery chamber 12*b* and the transfer part 15 can be shortened as much as possible. Therefore, according to the substrate processing system 1 according to the present embodiment, the time during which the unprocessed wafer W makes contact with an air can be shortened as much as possible.

The control part 18 may determine only the conditions Q2 to Q4 among the above-described conditions Q1 to Q6. If the conditions Q2 to Q4 are satisfied, even when other conditions are not satisfied, it is possible to shorten at least the staying time of the unprocessed wafer W in the delivery part 14.

Returning to FIG. 6, in step S103, the control part 18 determines whether or not the processed wafer W is mounted on the delivery part 14 based on, for example, the state information 19*b*. If the processed wafer W is mounted on the delivery part 14 (if yes in step S103), the first transfer device 13 is instructed to execute the "take-out operation" and the "collection operation" (step S104). On the other hand, if the processed wafer W is not mounted on the delivery part (if no in step S103), the control part 18 instructs the first transfer device 13 to execute the "take-out operation" (step S105).

Subsequently, the control part 18 starts measuring time (step S106). The time measurement result is used in the next determination process in step S101.

Subsequently, the control part 18 determines whether or not all unprocessed wafers W in the process unit have been taken out from the carrier C based on, for example, the state information 19*b* (step S107). If the unprocessed wafer W remains in the carrier C (if no in step S107), the process proceeds to step S101. In step S101, as described above, it is determined whether or not the elapsed time from the start of the previous takeout operation has reached a threshold value. At least after this determination is affirmed, the execution of the next "take-out operation" is instructed. Therefore, the control part 18 causes the first transfer device 13 to execute the "take-out operation" at time intervals equal to or longer than the time required for the first transfer device 13 to take out the wafer W from the carrier C and mount it on the delivery part 14 and to take out the wafer W from the delivery part 14 and accommodate it in the carrier C. Furthermore, if the route securing conditions are not satisfied due to, for example, the wafer W staying in the processing unit 16, the "collection operation" is continued without performing the "take-out operation". Accordingly, the processed wafer W does not overstay in the delivery part 14.

If it is determined in step S107 that all the unprocessed wafers W in the process unit have been taken out from the carrier C (if yes in step S107), the control part 18 instructs the first transfer device 13 to execute the "collection operation" each time when the processed wafer W is mounted on the delivery part 14 until all the processed wafers W are accommodated in the carrier C. After all the processed wafers W are accommodated in the carrier C, the transfer control process for the first transfer device 13 is finished.

As described above, the substrate processing system 1 (an example of the substrate processing apparatus) according to the present embodiment includes the carrier mounting part 11, the delivery part 14 (an example of the substrate mounting part), the first transfer device 13, the plurality of processing units 16 (an example of the processing parts), the second transfer device 17 and the control part 18. The carrier mounting part 11 mounts the carrier C that accommodates a plurality of wafers W (an example of substrates). The delivery part 14 can mount a plurality of wafers W thereon. The first transfer device 13 transfers the wafer W between the carrier C mounted on the carrier mounting part 11 and the delivery part 14. The plurality of processing units 16 process the wafers W. The second transfer device 17 transfers the wafers W between the plurality of processing units 16 and the delivery part 14. The control part 18 controls the first transfer device 13, the plurality of processing units 16 and the second transfer device 17. Furthermore, the control part 18 causes the first transfer device 13 to execute the "take-out operation" for taking out the wafer W from the carrier C and mounting the wafer W on the delivery part 14 at time intervals equal to or longer than the time required for the first transfer device 13 to take out the wafer W from the carrier C and mount it on the delivery part 14 and to take out the wafer W from the delivery part 14 and accommodate it in the carrier C.

Therefore, according to the substrate processing system 1 according to the present embodiment, it is possible to prevent all the wafers W in the delivery part 14 from staying in the delivery part 14 longer than an allowable time.

(First Modification)

By the way, in the substrate processing system 1, various events may occur separately from the above-described substrate processing process for the wafer W. Examples of the events include a chamber cleaning process for cleaning the inside of the chamber 20 of the processing unit 16, a dummy dispensing process for discharging a processing fluid from a nozzle provided in the processing fluid supply part 40, and the like.

Each event occurs when a preset event occurrence condition is satisfied. For example, the dummy dispensing process occurs when a state in which the nozzle does not discharge the processing fluid continues for a certain period of time.

If these events are executed during the execution of the substrate processing process, the overstaying of the wafer W may occur. For example, if an event of using the second transfer device 17 occurs after the first transfer device 13 mounts the unprocessed wafer W on the delivery part 14, the second transfer device 17 cannot take out the unprocessed wafer W from the delivery part 14 until the event comes to an end. As a result, the unprocessed wafer W overstays in the delivery part 14.

Figure 8:
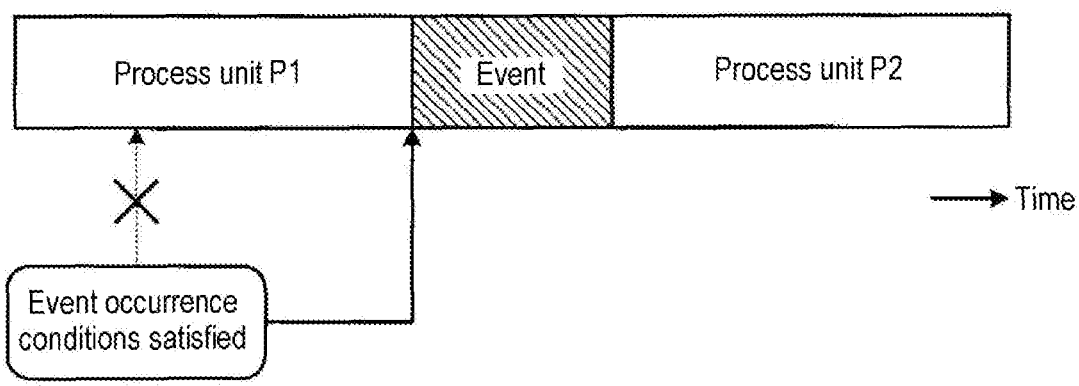
FIG. 8 is a view for explaining a process of suppressing execution of an event.

Therefore, in the substrate processing system 1, the execution of the event may be suppressed when the event occurrence condition is satisfied during the execution of the substrate processing process. This point will be described with reference to FIG. 8. FIG. 8 is a view for explaining a process for suppressing the execution of an event.

As shown in FIG. 8, for example, it is assumed that an event occurrence condition for a certain event is satisfied during the execution of a substrate processing process for a process unit P1. In this case, the control part 18 of the control device 4 suppresses the execution of an event until the substrate processing process for the process unit P1 is completed, i.e., until all the wafers W included in the process unit P1 are taken out from the carrier C and all the taken-out wafers W are accommodated in the carrier C.

Then, after the substrate processing process for the process unit P1 is terminated and before the substrate processing process for the next process unit P21 is started, the control part 18 instructs the execution of an event for which an event occurrence condition is satisfied during the execution of the substrate processing process for the process unit P1.

As described above, when a specific event occurrence condition is satisfied during the execution of one process unit having a plurality of wafers W as a process target, the control part 18 may execute an event after the execution of one process unit is terminated and before the execution of another process unit is started. By doing so, it is possible to make it difficult for the wafer W to overstay in the delivery part 14.

(Second Modification)

For example, after the first transfer device 13 mounts the unprocessed wafer W on the delivery part 14, if an abnormality occurs in the empty processing unit 16 so that the wafer W cannot be processed, the unprocessed wafer W overstays in the delivery part 14 until another processing unit 16 becomes empty.

Therefore, after the first transfer device 13 mounts the unprocessed wafer W on the delivery part 14 and before the second transfer device 17 is instructed to execute the "take-out operation", the control part 18 may re-determine whether or not a route from the delivery part 14 to the processing unit 16 is secured. If the route is not secured, the control part 18 may cause the second transfer device 17 to execute a preset retraction operation for avoiding contact of the wafer W with the air.

Figure 9:
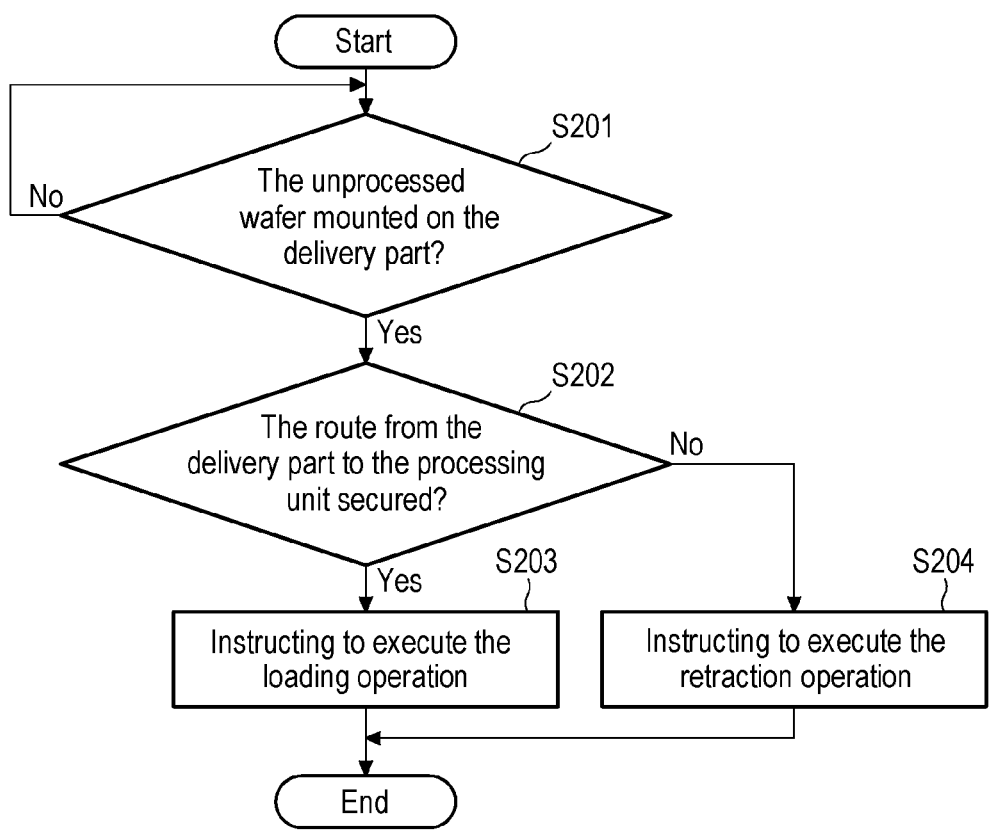
FIG. 9 is a flowchart showing the content of a route redetermination process.

The content of the route re-determination process will be described with reference to FIG. 9. FIG. 9 is a flowchart showing the content of the route re-determination process.

As shown in FIG. 9, the control part 18 determines whether or not the unprocessed wafer W is mounted on the delivery part 14 based on, for example, the state information 19b (step S201). If the unprocessed wafer W is not mounted on the delivery part 14 (if no in step S201), the control part 18 repeats the process of step S201 until the unprocessed wafer W is mounted on the delivery part 14.

On the other hand, if the unprocessed wafer W is mounted on the delivery part 14 (if yes in step S201), the control part 18 determines whether or not a route from the delivery part 14 to the processing unit 16 is secured (step S202). For example, if the conditions Q3 to Q6 shown in FIG. 7 are satisfied, the control part 18 determines that the route from the delivery part 14 to the processing unit 16 is secured.

If it is determined in step S202 that the route from the delivery part 14 to the processing unit 16 is secured (if yes step S202), the control part 18 instructs the second transfer device 17 to execute the "loading operation" (step S203).

On the other hand, if the route from the delivery part 14 to the processing unit 16 is not secured (if no in step S202), the control part 18 instructs the second transfer device 17 to execute a "retraction operation" (step S204).

In this regard, the "retraction operation" is a process of loading the unprocessed wafer W mounted on the delivery part 14 into a predetermined retraction place filled with an inert gas. For example, the retraction place is provided above or below the delivery part 14 in the delivery chamber 12b. For example, a chamber capable of sealing the inside thereof and a gas supply part for supplying an inert gas into the chamber are provided at the retraction place. By retracting the wafer W to such a retraction place, it is possible to shorten the time during which the wafer W is exposed to the air.

When an abnormality occurs in the empty processing unit 16, if the wafer W can be accommodated in the chamber 20 of the empty processing unit 16 and the inert gas can be supplied from the FFU 21 into the chamber 20, the control part 18 may execute an operation of taking out the unprocessed wafer W from the delivery part 14 and loading it into the empty processing unit 16 as a "retraction operation". This also makes it possible to shorten the time during which the wafer W is exposed to the air.

(Third Modification)

In the above-described embodiment, when the current state of the substrate processing system 1 satisfies the predetermined route securing condition, the first transfer device 13 is instructed to execute the "take-out operation".

However, the present disclosure is not limited thereto. The control part 18 may predict satisfaction of the route securing conditions and may instruct the first transfer device 13 to execute the "take-out operation" a predetermined time before the time when the route securing conditions are satisfied.

Figure 10:
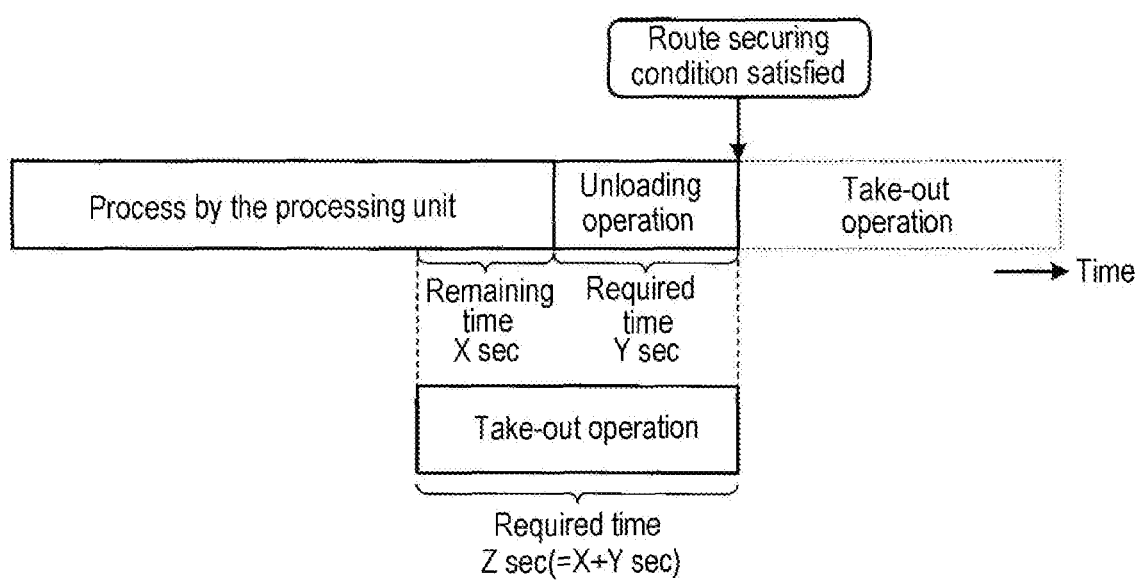
FIG. 10 is a view for explaining a modified example of the transfer control process for the first transfer device.

This point will be described with reference to FIG. 10. FIG. 10 is a view for describing a modification of the transfer control process for the first transfer device.

As shown in FIG. 10, for example, it is assumed that the route securing conditions (the conditions Q1 to Q6 shown in FIG. 7) are satisfied at the time when the "unloading operation" by the second transfer device 17 comes to an end. In the above-described embodiment, when the route securing conditions are satisfied, i.e., after the "unloading operation" by the second transfer device 17 is completed, the first transfer device 13 is instructed to execute the "take-out operation" (the "take-out operation" indicated by the broken line in FIG. 10). In this case, the processed wafer W overstays in the delivery part 14 until the "take-out operation" by the first transfer device 13 is completed and the "collection operation" is started.

In the meantime, when the total time of the remaining time Xsec of the process by the processing unit 16 and the required time Ysec of the "unloading operation" is equal to or less than the required time Zsec of the "take-out operation", the control part 18 according to the modification instructs the first transfer device 13 to execute the "take-out operation".

As a result, the first transfer device 13 can finish the "take-out operation" at a timing equivalent to the timing at which the "unloading operation" by the second transfer device 17 comes to an end, and can immediately take out the processed wafer W mounted on the delivery part 14 by the second transfer device 17 from the delivery part 14 to transfer the processed wafer W to the carrier C.

As described above, after determining that the elapsed time from the start of the previous take-out operation has reached the threshold value, the control part 18 may instruct the first transfer device 13 to execute the "take-out operation" at the time that precedes, by the time equal to or shorter than the time required for the "take-out operation", the time at which the transfer route of the wafer W from the carrier C to the processing unit 16 is expected to be secured. Accordingly, it is possible to shorten the staying time of the processed wafer W in the delivery part 14.

In the control part 18, the remaining time until the process by the processing unit 16 is completed can be calculated based on, for example, the recipe information 19*a* and the state information 19*b*, for example. Furthermore, when the processing unit 16 has a function of measuring the remaining time, it is possible to directly acquire the remaining time from the processing unit 16. In the modification, it is assumed that the memory part 19 (see FIG. 4) stores predetermined times as the required times for the "take-out operation" and the "unloading operation" and further that the control part 18 acquires these pieces of information from the memory part 19.

(Other Modifications)

In the above-described embodiment, there has been described the example in which the first transfer device 13 transfers the wafers W one by one using the wafer holding mechanism 13*a* that can hold one wafer W. A plurality of wafers W may be collectively transferred using a wafer holding mechanism capable of holding the plurality of wafers W.

Further, in the above-described embodiment, when the elapsed time from the start of the previous "take-out operation" reaches the threshold value and the transfer route of the wafer W is secured, the first transfer device 13 is instructed to execute the "take-out operation". However, the control part 18 does not necessarily need to determine whether or not the transfer route of the wafer W is secured. In other words, regardless of whether the transfer route of the wafer W is secured, the control part 18 may instruct the first transfer device 13 to execute the "take-out operation" when the elapsed time from the start of the previous "take-out operation" reaches a threshold value.

In addition, when there are a plurality of empty processing units 16, the control part 18 may determine the empty processing units 16 into which the unprocessed wafers W are loaded, according to the number of executions of a process of each empty processing unit 16. For example, the control part 18 may load the unprocessed wafers W into the empty processing unit 16 sequentially from the empty processing unit 16 having the smaller number of executions of a process. Accordingly, it is possible to prevent occurrence of a deviation in the number of executions of a process between the processing units 16.

In addition, when two consecutive process units are executed based on the same recipe information, the control part 18 may execute one process unit using the upper delivery part 14, the second transfer device 17 and the plurality of processing units, while executing the other process unit using the lower delivery part 14, the second transfer device 17 and the plurality of processing units 16. On the other hand, when two consecutive process units are executed based on different pieces of recipe information, if these process units are executed at the same time, the execution cycle of the "take-out operation" by the first transfer device 13 may collapse. Therefore, when two consecutive process units are executed based on different pieces of recipe information, the control part 18 may execute the other process unit after one process unit comes to an end.

Additional effects and modifications can be easily derived by those skilled in the art. Thus, the broader aspects of the present disclosure are not limited to the specific details and the representative embodiments shown and described above. Accordingly, various modifications can be made without departing from the spirit or scope of the general inventive concept as defined by the appended claims and their equivalents.

EXPLANATION OF REFERENCE NUMERALS

W: wafer, 1: substrate processing system, 11: carrier mounting part, 12: transfer part, 12*a*: loading/unloading chamber, 12*b*: delivery chamber, 13: first transfer device, 14: delivery part, 15: transfer part, 16: processing unit, 18 control part

What is claimed is:

1. A substrate processing apparatus, comprising:
a carrier mounting part configured to mount a carrier that accommodates a plurality of substrates;
a substrate mounting part capable of mounting the plurality of substrates;
a first transfer device configured to transfer the plurality of substrates between the carrier mounted on the carrier mounting part and the substrate mounting part;
a plurality of processing parts configured to process the plurality of substrates;
a second transfer device configured to transfer the plurality of substrates between the plurality of processing parts and the substrate mounting part; and
a controller configured to control the first transfer device, the plurality of processing parts and the second transfer device,
wherein the controller is programmed to:
store, in advance, a shortest required time with respect to the first transfer device during a predetermined substrate processing process, the shortest required time being from a first time point when the first transfer device takes out the substrate from a predetermined initial position in the carrier for processing to a second time point when the first transfer device returns the substrate to the predetermined initial position in the carrier; and
perform executing, plural times, a take-out operation using the first transfer device, the take-out operation including taking out the substrate from the carrier and mounting the substrate on the substrate mounting part, at time intervals equal to or longer than the shortest required time.

2. The apparatus of claim 1, wherein the controller determines whether or not an elapsed time from a previous take-out operation has reached a threshold value, which is set, in advance, to be equal to or longer than the shortest required time, and when it is determined that the threshold value has been reached, the controller causes the first transfer device to execute the take-out operation.

3. The apparatus of claim 2, wherein the controller further determines whether or not a transfer route of the substrate from the carrier to the plurality of processing parts is secured, and when it is determined that the elapsed time from the previous take-out operation has reached the threshold value and the transfer route is secured, the controller causes the first transfer device to execute the take-out operation.

4. The apparatus of claim 3, wherein the controller determines that the transfer route is secured, when a plurality of route securing conditions including a condition that at least one empty slot capable of accommodating the substrate exists in the substrate mounting part, a condition that the second transfer device does not hold the substrate and a condition that at least one empty processing part not accommodating the substrate exists among the plurality of processing parts, is satisfied.

5. The apparatus of claim 4, wherein the plurality of the route securing conditions further include a condition that the first transfer device does not hold the substrate.

6. The apparatus of claim 2, wherein after determining that the elapsed time from the previous take-out operation has reached the threshold value, the controller causes the first transfer device to execute the take-out operation at a third time point that precedes, by a first time period equal to or shorter than a second time period required for the take-out operation, a fourth time point at which a transfer route of the substrate from the carrier to the processing parts is expected to be secured.

7. The apparatus of claim 3, wherein the controller determines that the transfer route is secured, when a plurality of route securing conditions including a condition that an empty slot capable of accommodating a processed substrate as a substrate processed by the processing parts exists in the substrate mounting part, is satisfied.

8. The apparatus of claim 4, wherein the plurality of the route securing conditions further include a condition that preparation for the process start in the at least one empty processing part is completed.

9. The apparatus of claim 1, wherein if, during execution of one process unit having the plurality of substrates as a process target, a predetermined condition of an event other than the execution of the one process unit is satisfied, the event is executed after the execution of the one process unit is terminated and before execution of another process unit is started.

10. A substrate transfer method, comprising:
storing, in advance in a controller, a shortest required time with respect to a first transfer device during a predetermined substrate processing process,
wherein the first transfer device transfers a substrate among a plurality of substrates between a carrier mounted on a carrier mounting part for mounting the carrier capable of accommodating the plurality of substrates and a substrate mounting part capable of mounting the plurality of substrates, and the shortest required time is from a first time point when the first transfer device takes out the substrate from a predetermined initial position in the carrier for processing to a second time point when the first transfer device returns the substrate to the predetermined initial position in the carrier;
executing, plural times, a take-out operation using the first transfer device at time intervals equal to or longer than the shortest required time,
wherein the take-out operation includes taking out the substrate from the carrier and mounting the substrate on the substrate mounting part; and
executing a loading operation using a second transfer device,
wherein the second transfer device transfers the substrate between a plurality of processing parts for processing the plurality of substrates and the substrate mounting part, and the loading operation includes taking out the substrate from the substrate mounting part and loading the substrate into the processing parts.

* * * * *